(12) United States Patent
Chen

(10) Patent No.: US 10,354,610 B2
(45) Date of Patent: Jul. 16, 2019

(54) SCANNING CIRCUIT, DISPLAY DEVICE AND METHOD FOR DRIVING SCANNING CIRCUIT

(71) Applicants: HKC CORPORATION LIMITED, Shenzhen (CN); CHONGQING HKC OPTOELECTRONICS TECHNOLOGY CO., LTD., Jieshi, Banan District (CN)

(72) Inventor: Yu-jen Chen, Banan District (CN)

(73) Assignees: HKC Corporation Limited, Shenzhen, Guangdong (CN); Chongqing HKC Optoelectronics Technology Co., Ltd., Jieshi, Chongqing (CN)

( * ) Notice: Subject to any disclaimer, the term of this patent is extended or adjusted under 35 U.S.C. 154(b) by 0 days.

(21) Appl. No.: 15/744,197

(22) PCT Filed: Jul. 26, 2017

(86) PCT No.: PCT/CN2017/094559
§ 371 (c)(1),
(2) Date: Jan. 12, 2018

(87) PCT Pub. No.: WO2018/133359
PCT Pub. Date: Jul. 26, 2018

(65) Prior Publication Data
US 2019/0005914 A1 Jan. 3, 2019

(30) Foreign Application Priority Data
Jan. 22, 2017 (CN) .......................... 2017 1 0046228

(51) Int. Cl.
*G09G 5/00* (2006.01)
*G09G 3/20* (2006.01)
*G11C 19/28* (2006.01)

(52) U.S. Cl.
CPC ............... *G09G 5/003* (2013.01); *G09G 3/20* (2013.01); *G11C 19/28* (2013.01);
(Continued)

(58) Field of Classification Search
CPC ...... G09G 5/003; G09G 3/20; G09G 2310/08; G09G 2310/0267; G09G 2310/0243; G09G 2330/028
See application file for complete search history.

(56) References Cited

U.S. PATENT DOCUMENTS 8,902,203 B2 12/2014 Hsu et al.
2009/0189883 A1 7/2009 Chung et al.
2011/0169796 A1* 7/2011 Guo ..................... G09G 3/3677
345/208

FOREIGN PATENT DOCUMENTS

CN 102129845 7/2011
CN 105244005 1/2016
(Continued)

OTHER PUBLICATIONS

International Search Report Form PCT/ISA/220, International Application No. PCT/CN2017/094559, pp. 1-6, International filing Date Jul. 26, 2017, dated Oct. 31, 2017.

*Primary Examiner* — Alexander Eisen
*Assistant Examiner* — Kebede T Teshome
(74) *Attorney, Agent, or Firm* — Bond Schoeneck & King, PLLC; George McGuire

(57) ABSTRACT

A scanning circuit, a display device and a method for driving a scanning circuit are disclosed. The scanning circuit includes: a shading module, a control terminal of the shading module being electrically connected to a control signal output terminal of a control module and the shading module being configured to generate a shading voltage signal according to a clock control signal inputted to its control module; and a scanning module, a control terminal of the (Continued)

scanning module being electrically connected to the control signal output terminal of the control module and an input terminal of the scanning module being electrically connected to an output terminal of the shading module. The scanning module is configured to output a scanning signal with shading according to the clock control signal and the shading voltage signal.

18 Claims, 9 Drawing Sheets

(52) U.S. Cl.
CPC ............... *G09G 2310/0243* (2013.01); *G09G 2310/0245* (2013.01); *G09G 2310/0267* (2013.01); *G09G 2310/08* (2013.01); *G09G 2330/028* (2013.01)

(56) References Cited

FOREIGN PATENT DOCUMENTS

| | | |
|---|---|---|
| CN | 105374337 | 3/2016 |
| CN | 105825814 | 8/2016 |
| CN | 106847153 | 6/2017 |

* cited by examiner

US 10,354,610 B2

SCANNING CIRCUIT, DISPLAY DEVICE AND METHOD FOR DRIVING SCANNING CIRCUIT

CROSS-REFERENCE TO RELATED APPLICATIONS

This application is the United States National Phase Entry of PCT Application No. PCT/CN2017/094559 filed on Jul. 26, 2017, which claims priority to Chinese patent application No. 201710046228.8, filed on Jan. 22, 2017, the entire disclosure of each of which is incorporated herein by reference.

TECHNICAL FIELD

The present disclosure relates to a scanning circuit, a display device and a method for driving a scanning circuit.

BACKGROUND

A display panel generally includes a plurality of pixels. In a process of controlling the pixels of the display panel to display, a gate driving signal needs to be provided to turn on the pixels. The gate driving signal is generally provided by a scanning circuit in the display panel. To provide a scanning signal with shading for the pixels, a logic board or control board (such as a timer controller, TCON) generally needs to provide a variety of control signals. For example, a plurality of output ports of the TCON provide a plurality of clock signals for each module, and the TCON has a large area and a complex circuit structure.

SUMMARY

The present disclosure provides a scanning circuit, a display device and a method for driving a scanning circuit, so as to save output pins of a control module of the scanning circuit, realize miniaturization of the control module and realize narrow bezel design of a display panel while the scanning circuit outputs a scanning signal with shading.

In a first aspect, embodiments of the present disclosure provide a scanning circuit, including:

a control module;
a shading module, a control terminal of the shading module is electrically connected to a control signal output terminal of the control module, and the shading module is configured to generate a shading voltage signal according to a clock control signal provided by the control module; and
a scanning module, a control terminal of the scanning module is electrically connected to the control signal output terminal of the control module, an input terminal of the scanning module is electrically connected to an output terminal of the shading module, and the scanning module is configured to output a scanning signal with shading according to the clock control signal and the shading voltage signal.

In a second aspect, embodiments of the present disclosure provide a display device, including:

a display panel; and
a control board electrically connected to the display panel and including the scanning circuit provided in any embodiment of the present disclosure.

In a third aspect, embodiments of the present disclosure further provide a method for driving the scanning circuit. The scanning circuit includes:

a shading module, a control terminal of the shading module is electrically connected to a control signal output terminal of the control module; and
a scanning module, a control terminal of the scanning module is electrically connected to the control signal output terminal of the control module, and an input terminal of the scanning module is electrically connected to an output terminal of the shading module.

The driving method includes:

the shading module generates a shading voltage signal according to a clock control signal provided by the control module; and
the scanning module generates a scanning signal with shading according to the clock control signal and the shading voltage signal.

In the technical solution provided in embodiments of the present disclosure, the scanning circuit (specifically: the scanning module) can output the scanning signal with shading, and the outputted scanning signal with shading can reduce an influence of capacitive coupling at a moment of turning off the scanning circuit, so as to ensure image quality. In addition, under a condition of ensuring that the scanning circuit outputs the scanning signal with shading, the control terminal of the shading module and the control terminal of the scanning module are both electrically connected to the control signal output terminal of the control module, i.e., a signal provided to the control terminal of the shading module and a signal provided to the control terminal of the scanning module are integrated and are provided by a same control signal output terminal (control signal output pin) of the control module. The control module just needs only one control signal output terminal to realize supply of the clock signal of the entire scanning circuit, so as to achieve that the scanning circuit outputs the scanning signal with shading, thereby saving the output pin of the control module, benefiting miniaturization of the control module, saving cost, also reducing signal wiring, benefiting PCB wiring, reducing an area of a circuit layout and being easy to realize a narrow bezel.

BRIEF DESCRIPTION OF DRAWINGS

Exemplary embodiments of the present disclosure are described in detail below with reference to drawings, so that those ordinary skilled in the art understand above and other features of the present disclosure more clearly.

DETAILED DESCRIPTION

The present disclosure is further described below in detail with reference to drawings and embodiments. It should be understood that specific embodiments described herein are only used for explaining the present disclosure, not limiting the present disclosure. It should also be noted that to facilitate description, drawings only show some structures relevant to the present disclosure, not all of the structures. The following embodiments and features in the embodiments can be mutually combined in case of no conflict.

Figure 1:
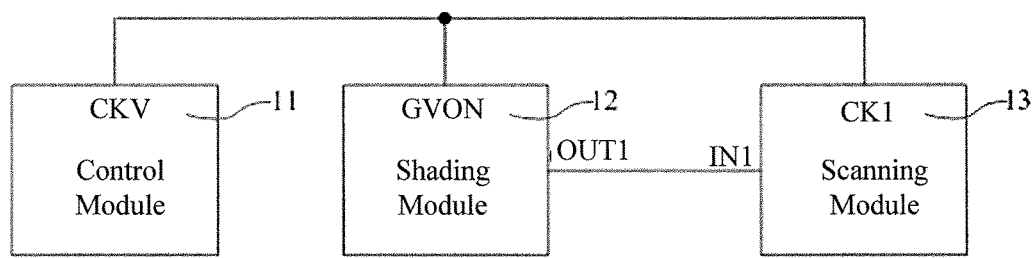
FIG. 1 is a structural diagram illustrating a scanning circuit provided in embodiments of the present disclosure.

FIG. 1 is a structural diagram illustrating a scanning circuit provided in embodiments of the present disclosure. By referring to FIG. 1, the scanning circuit includes a control module 11, a shading module 12 and a scanning module 13. A control signal output terminal CKV of the control module 11 is electrically connected to a control terminal GVON of the shading module 12 and a control terminal CK1 of the scanning module 13. An output terminal OUT1 of the shading module 12 is electrically connected to an input terminal IN1 of the scanning module 13. The shading module 12 is configured to generate a shading voltage signal according to a clock control signal provided by the control terminal GVON, and the scanning module 13 is configured to output a scanning signal with shading according to the clock control signal provided by the control terminal CK1 and the shading voltage signal provided by the input terminal IN1.

In the technical solution provided in embodiments of the present disclosure, the scanning circuit (specifically: the scanning module) can output the scanning signal with shading, and the outputted scanning signal with shading can reduce an influence of capacitive coupling at a moment of turning off the scanning circuit, so as to ensure image quality. Under a condition of ensuring that the scanning circuit outputs the scanning signal with shading, the control terminal of the shading module and the control terminal of the scanning module are both electrically connected to the control signal output terminal of the control module, i.e., a signal provided by the control terminal of the shading module and a signal provided by the control terminal of the scanning module are integrated and are provided by a same control signal output terminal (control signal output pin) of the control module. The control module just needs only one control signal output terminal (control signal output pin) to realize supply of the clock signal of the entire scanning circuit, so as to achieve that the scanning circuit outputs the scanning signal with shading, thereby saving the output pin of the control module, benefiting miniaturization of the control module, saving cost, also reducing signal wiring, benefiting PCB wiring, reducing an area of a circuit layout and being easy to realize a narrow bezel. The control module in embodiments of the present disclosure may be a TCON for providing logic and/or control signals, or other modules or IC capable of providing logic and/or control signals.

Figure 2A:
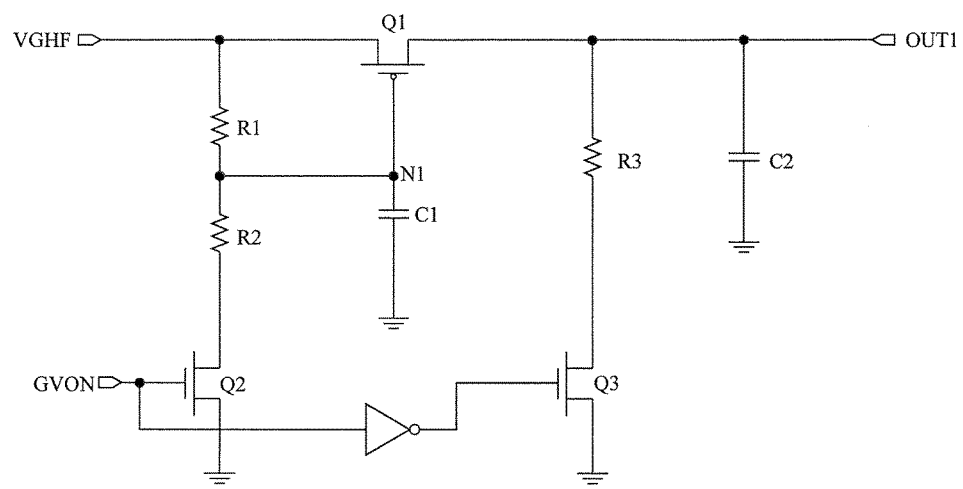
FIG. 2A is a circuit diagram illustrating a shading module provided in embodiments of the present disclosure.

FIG. 2A is a circuit diagram illustrating a shading module provided in embodiments of the present disclosure. By referring to FIG. 2A, in the scanning circuit provided in embodiments of the present disclosure, the shading module 12 includes an input terminal VGHF, a first transistor Q1, a second transistor Q2, a third transistor Q3, a first resistor R1, a second resistor R2, a third resistor R3, a first capacitor C1, a second capacitor C2 and a first inverter INV1.

A first electrode of the first transistor Q1 is electrically connected to the input terminal VGHF of the shading module 12. A second electrode of the first transistor Q1 is electrically connected to the output terminal OUT1 of the shading module 12. A gate electrode of the first transistor Q1 is electrically connected to a first electrode of the first capacitor C1. A second electrode of the first capacitor C1 is grounded. One end of the first resistor R1 is electrically connected to the first electrode of the first transistor Q1, and the other end of the first resistor R1 is electrically connected to the gate electrode of the first transistor Q1. A first electrode of the second transistor Q2 is electrically connected to one end of the second resistor R2, and the other end of the second resistor R2 is electrically connected to the first electrode of the first capacitor C1. A second electrode of the second transistor Q2 is grounded. A gate electrode of the second transistor Q2 is electrically connected to the control terminal GVON of the shading module 12. A first electrode of the third transistor Q3 is electrically connected to one end of the third resistor R3, and the other end of the third resistor R3 is electrically connected to the output terminal OUT1 of the shading module 12. A second electrode of the third transistor Q3 is grounded. A gate electrode of the third transistor Q3 is electrically connected to the output terminal of the first inverter INV1. An input terminal of the first inverter INV1 is electrically connected to the control terminal GVON of the shading module 12. A first electrode of the second capacitor C2 is electrically connected to the output terminal OUT1 of the shading module 12. A second electrode of the second capacitor C2 is grounded.

Figure 2B:
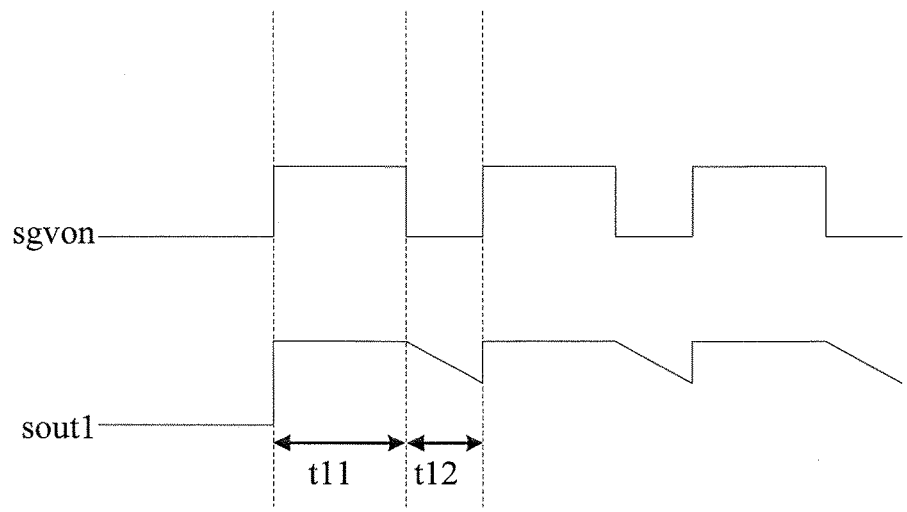
FIG. 2B is a drive timing diagram provided in embodiments of the present disclosure.

FIG. 2B is a timing diagram provided in embodiments of the present disclosure. By referring to FIG. 2B, "sgvon" denotes a signal inputted to the control terminal GVON of the shading module 12, and "sout1" denotes a signal outputted by the output terminal OUT1 of the shading module 12. An operation process of the shading module in embodiments of the present disclosure is exemplarily described below by taking FIG. 2A and FIG. 2B as examples. In the shading module in FIG. 2A, the first transistor Q1 is a P-type transistor, and the second transistor Q2 and the third transistor Q3 are N-type transistors. A high level signal is inputted to the input terminal VGHF of the shading module 12. The operation process of the shading module may include the following phases.

In a phase t11, a high level signal is inputted to the control terminal GVON of the shading module 12, the second transistor Q2 is turned on, and the third transistor Q3 is turned off. The high level signal inputted to the input terminal VGHF of the shading module 12 is subjected to voltage division by the first resistor R1 and the second resistor R2. A voltage of a first node N1 is the divided voltage. At this moment, a potential of the first node N1 is a low potential; and the first transistor Q1 is turned on. The high level signal inputted to the input terminal VGHF of the shading module 12 is transmitted to the output terminal OUT1 of the shading module 12 through the turned-on first transistor Q1. The output terminal OUT1 of the shading module 12 outputs a high level signal, and the inputted high level signal charges the second capacitor C2.

In a phase t12, a low level signal is inputted to the control terminal GVON of the shading module 12, the second transistor Q2 is turned off, and the third transistor Q3 is turned on. Since the second transistor Q2 is turned off, the high level signal inputted to the input terminal VGHF of the shading module 12 charges the first capacitor C1 and the potential of the first electrode of the first capacitor C1 is a high potential, i.e., the first node N1 is a high potential and the first transistor Q1 is turned off. Since the third transistor Q3 is turned on, the second capacitor C2 is discharged through the third resistor R3 and the third transistor Q3, i.e., the signal outputted by the output terminal OUT1 of the shading module 12 is shaded. After the phase t12, the signal outputted by the output terminal OUT1 of the shading module 12 changes by repeating the signals outputted in the t11 phase and the t12 phase.

It should be noted that a shading depth of the signal outputted in the phase t12 can be regulated by configuring a resistance value of the third resistor R3, where a duty ratio of the signal "sgvon" is adjustable, i.e., a duty ratio of the signal outputted by the control signal output terminal CKV of the control module 11 is adjustable. Shading time can be regulated by regulating the time of the signal "sgvon" in the phase t12, thereby forming different shading voltage signal waveforms and satisfying design needs of different display apparatuses. In the above example, the first transistor Q1 is the P-type transistor and the second transistor Q2 and the third transistor Q3 are N-type transistors. In another embodiment of the present disclosure, the first transistor Q1 may be an N-type transistor, and the second transistor Q2 and the third transistor Q3 may be P-type transistors.

Figure 3A:
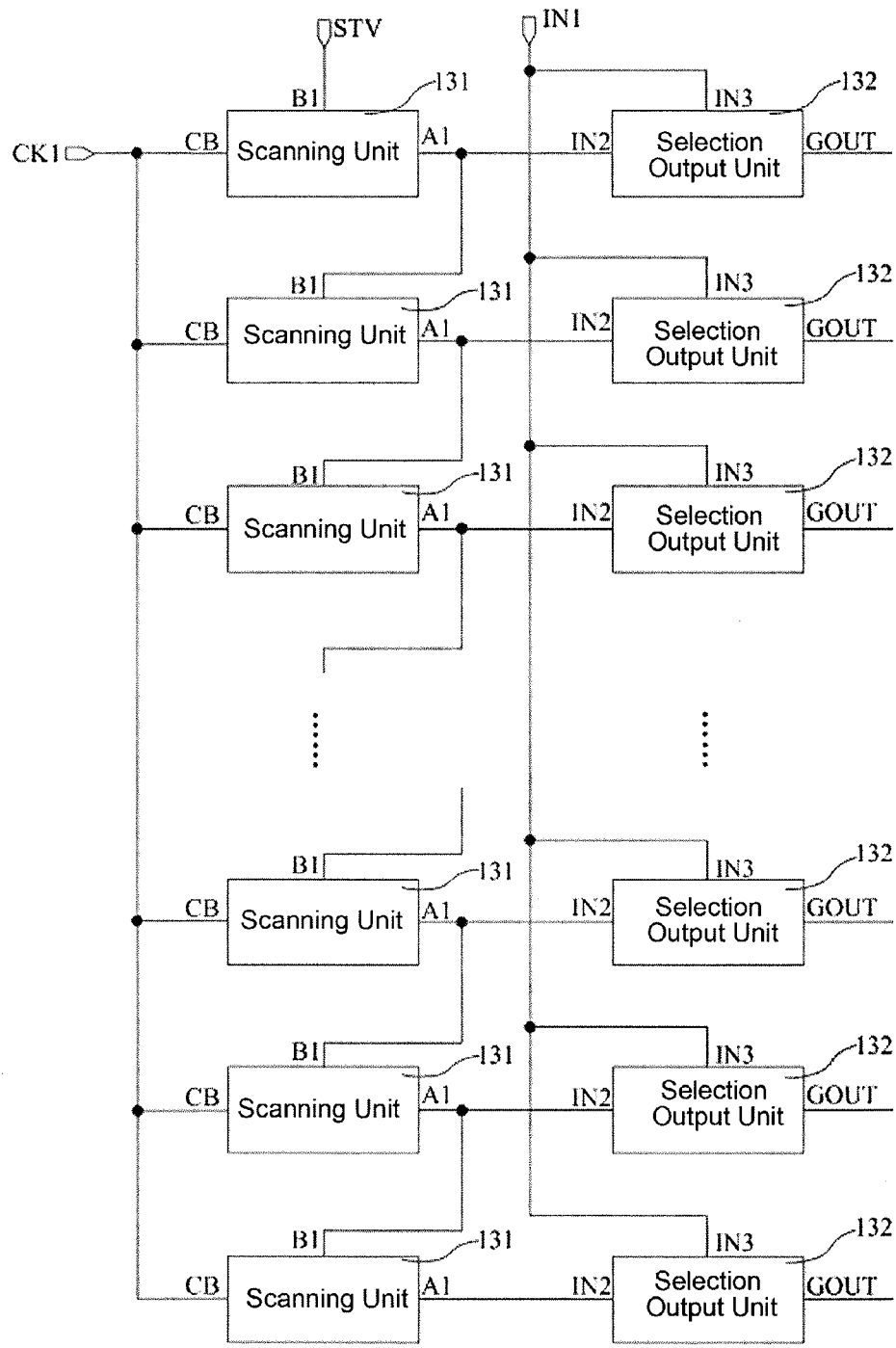
FIG. 3A is a structural diagram illustrating a scanning module provided in embodiments of the present disclosure.

FIG. 3A is a circuit diagram illustrating a scanning module provided in embodiments of the present disclosure. By referring to FIG. 3A, in the scanning circuit provided in embodiments of the present disclosure, the scanning module includes a trigger signal input terminal STV, a plurality of output terminals, a plurality of cascaded scanning units 131 and selection output units 132, and each scanning unit 131 corresponds to a respective selection output unit 132.

A trigger signal input terminal B1 of a first-level scanning unit 131 is electrically connected to the trigger signal input terminal STV of the scanning module. For two adjacent levels of the scanning units, an output terminal A1 of a proceeding-level scanning unit 131 is electrically connected to the trigger signal input terminal B1 of a succeeding-level scanning unit 131.

A clock signal input terminal CB of each scanning unit 131 is electrically connected to the control terminal CK1 of the scanning module.

Each selection output unit 132 includes a first input terminal IN2, a second input terminal IN3 and an output terminal GOUT. The first input terminal IN2 of the selection output unit 132 is electrically connected to the output terminal A1 of a corresponding scanning unit; the second input terminal IN3 of the selection output unit 132 is electrically connected to the input terminal IN1 of the scanning module; and the output terminals GOUT of the selection output units 132 are electrically connected to the plurality of output terminals of the scanning module in a one-to-one correspondence. The scanning units 131 are configured to output scanning control signals level by level, and the selection output unit 132 is configured to output a scanning signal with shading according to a scanning control signal inputted to the first input terminals IN2 and a shading voltage signal inputted to the second input terminal IN3.

Figure 3B:
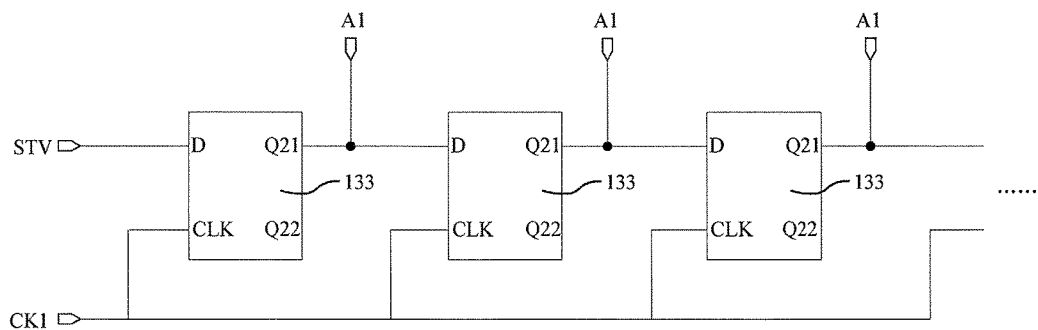
FIG. 3B is a circuit diagram illustrating a scanning unit provided in embodiments of the present disclosure.

Further, FIG. 3B is a circuit diagram illustrating a scanning unit provided in embodiments of the present disclosure. By referring to FIG. 3A and FIG. 3B, in the scanning circuit provided in embodiments of the present disclosure, the scanning unit includes a trigger 133. An input terminal D of the trigger 133 is electrically connected to the trigger signal input terminal B1 of the scanning unit, i.e., an input terminal of the trigger 133 is electrically connected to the trigger signal input terminal STV of the scanning module. Ann output terminal of the trigger 133 is electrically connected to the output terminal A1 of the scanning unit. A clock signal input terminal CLK of the trigger 133 is electrically connected to the clock signal input terminal CB of the scanning unit, i.e., the clock signal input terminal CLK of the trigger 133 is electrically connected to the control terminal CK1 of the scanning module.

Figure 3C:
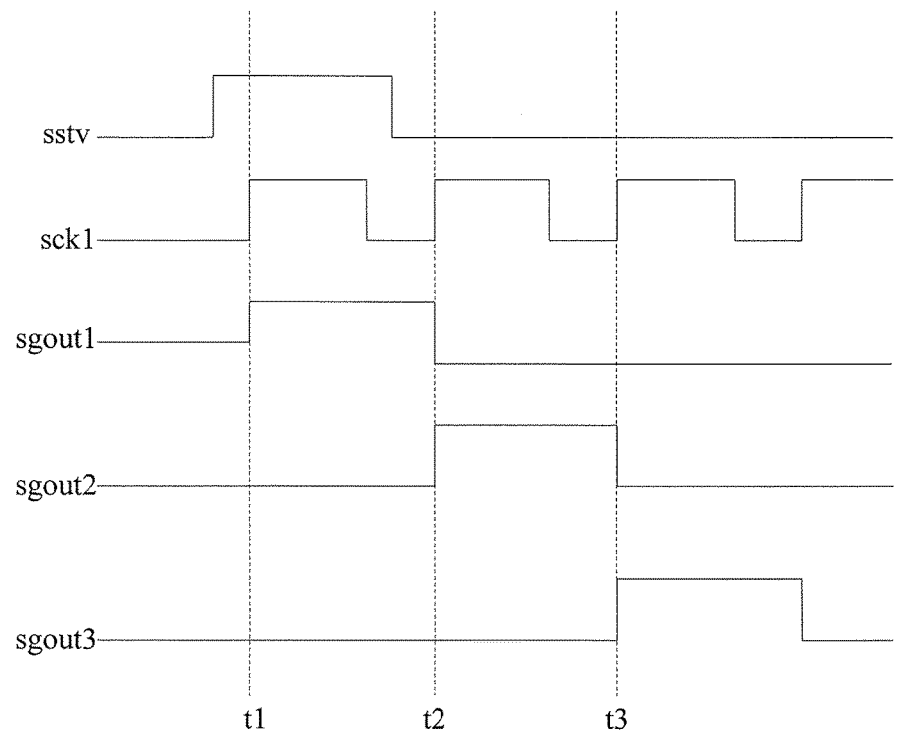
FIG. 3C is another drive timing diagram provided in embodiments of the present disclosure.

FIG. 3C is another drive timing diagram provided in embodiments of the present disclosure. By referring to FIG. 3C and FIG. 3B, "sstv" denotes a signal inputted to the trigger signal input terminal STV of the scanning module, and "sck1" denotes a signal inputted to the control terminal CK1 of the scanning module. "sgout1", "sgout2" and "sgout3" respectively denotes signals outputted by output terminals Q21 of first three levels of triggers 133. A first-level trigger, a second-level trigger, a third-level trigger and the like can be successively seen from left to right in FIG. 3B. An operation process of the scanning units in embodiments of the present disclosure is described below by taking FIG. 3B and FIG. 3C as examples. The operation process of the plurality of scanning units may include the following phases.

At a moment of t1, a high level signal is inputted to the trigger signal input terminal STV of the scanning module. When the signal inputted to the control terminal CK1 of the scanning module is changed from a low level to a high level, the output terminal Q21 of the first-level trigger 133 outputs a high level signal, i.e., a signal outputted by the output terminal Q21 of the first-level trigger 133 is the same as a signal inputted to the trigger signal input terminal D. The signal outputted by the output terminal Q21 of the first-level trigger 133 is unchanged, until a rising edge of a next pulse of the signal inputted to the clock signal input terminal CLK of the first-level trigger 133 arrives. At a moment of t2, the signal inputted to the control terminal CK1 of the scanning module is changed from a low level to a high level, and the rising edge of the next pulse of the signal inputted to the clock signal input terminal of the first-level trigger 133 arrives. At this moment, a low level signal is inputted to the trigger signal input terminal STV of the scanning module, and then the output terminal Q21 of the first-level trigger 133 outputs a low level signal.

At the moment of t2, the signal inputted to the clock signal input terminal CLK of the second-level trigger 133 is changed from a low level to a high level, i.e., the rising edge of the signal inputted to the clock signal input terminal CLK arrives. A high level signal is inputted to the trigger signal input terminal D of the second-level trigger 133 and the output terminal Q21 of the second-level trigger 133 outputs a high level signal, i.e., the signal outputted by the output terminal Q21 of the second-level trigger 133 is the same as the signal inputted to the input terminal D. The signal outputted by the output terminal Q21 of the second-level trigger 133 is unchanged, until a rising edge of a next pulse of the signal inputted to the clock signal input terminal CLK of the second-level trigger 133 arrives. At a moment of t3, the signal inputted to the control terminal CK1 of the scanning module is changed from a low level to a high level, i.e., the rising edge of the next pulse of the signal inputted to the clock signal input terminal CLK of the second-level trigger 133 arrives. At this moment, a low level signal is inputted to the trigger signal input terminal STV of the scanning module, and then the output terminal Q21 of the second-level trigger 133 outputs a low level signal. In this way, triggers each output a scanning control signal level by level.

Optionally, in embodiments of the present disclosure, the trigger is a D trigger. In embodiments of the present disclosure, the scanning unit may include a shift register, and a plurality of cascaded shift registers output the scanning control signals level by level.

Figure 3D:
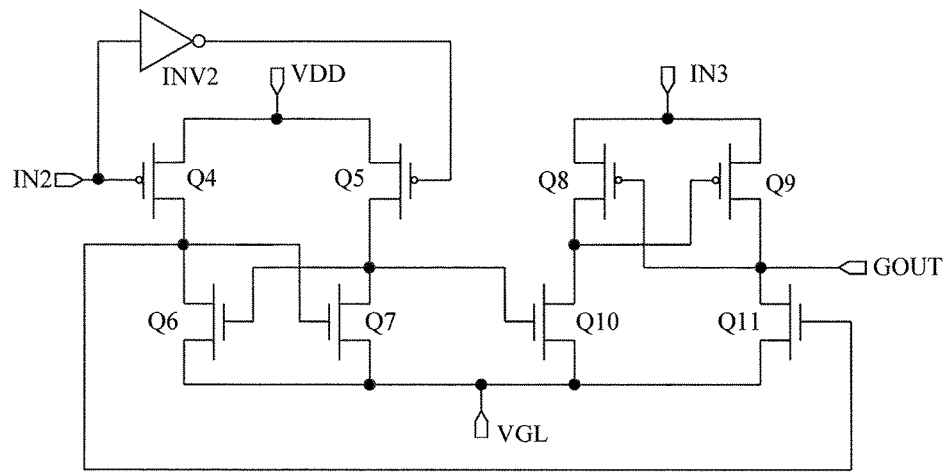
FIG. 3D is a circuit diagram illustrating a selection output unit provided in embodiments of the present disclosure.

FIG. 3D is a circuit diagram illustrating a selection output unit provided in embodiments of the present disclosure. By referring to FIG. 3D, each selection output unit includes a fourth transistor Q4, a fifth transistor Q5, a sixth transistor Q6, a seventh transistor Q7, an eighth transistor Q8, a ninth transistor Q9, a tenth transistor Q10, an eleventh transistor Q11, and a second inverter INV2. A first electrode of the fourth transistor Q4 is electrically connected to a first level signal input terminal VDD of the selection output unit; a second electrode of the fourth transistor Q4 is electrically connected to a second electrode of the sixth transistor Q6; and a gate electrode of the fourth transistor Q4 is electrically connected to the first input terminal IN2 of the selection output unit. A first electrode of the fifth transistor Q5 is electrically connected to the first level signal input terminal, a second electrode of the fifth transistor Q5 is electrically connected to a second electrode of the seventh transistor Q7, and a gate electrode of the fifth transistor Q5 is electrically connected to an output terminal of the second inverter INV2. A first electrode of the sixth transistor Q6 is electrically connected to a second level signal input terminal VGL, and a gate electrode of the sixth transistor Q6 is electrically connected to the second electrode of the fifth transistor Q5. A first electrode of the seventh transistor Q7 is electrically connected to the second level signal input terminal VGL, and a gate electrode of the seventh transistor Q7 is electrically connected to the second electrode of the fourth transistor Q4. A first electrode of the eighth transistor Q8 is electrically connected to the second input terminal IN3 of the selection output unit, a second electrode of the eighth transistor Q8 is electrically connected to a second electrode of the tenth transistor Q10, and a gate electrode of the eighth transistor Q8 is electrically connected to a second electrode of the ninth transistor Q9. A first electrode of the ninth transistor Q9 is electrically connected to the second input terminal IN3, the second electrode of the ninth transistor Q9 is electrically connected to the output terminal of the selection output unit, and a gate electrode of the ninth transistor Q9 is electrically connected to the second electrode of the eighth transistor Q8. A first electrode of the tenth transistor Q10 is electrically connected to the second level signal input terminal VGL, and a gate electrode of the tenth transistor Q10 is electrically connected to the second electrode of the fifth transistor. A first electrode of the eleventh transistor Q11 is electrically connected to the second level signal input terminal VGL, a second electrode of the eleventh transistor Q11 is electrically connected to the second electrode of the ninth transistor Q9 and a gate electrode of the eleventh transistor Q11 is electrically connected to the second electrode of the fourth transistor Q4. The input terminal of the second inverter INV2 is electrically connected to the first input terminal IN2 of the selection output unit.

Figure 3E:
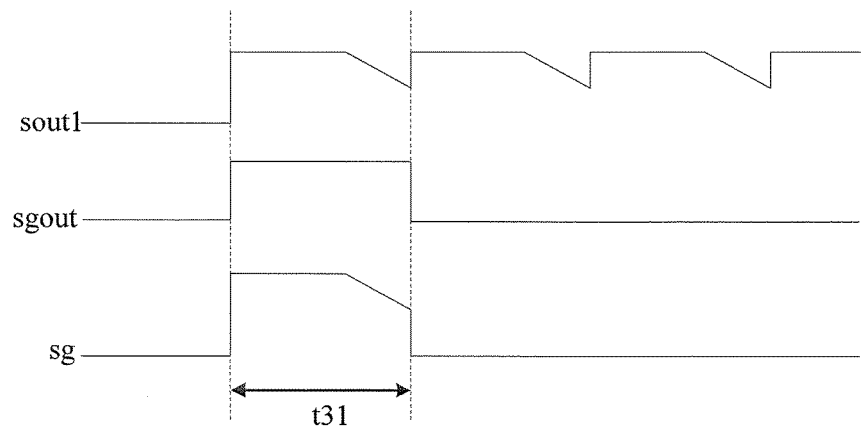
FIG. 3E is another drive timing diagram provided in embodiments of the present disclosure.

FIG. 3E is another timing diagram provided in embodiments of the present disclosure. "sout1" denotes a signal outputted by the output terminal of the shading module, i.e., a signal inputted to the second input terminal IN3 of the selection output unit. "sgout" denotes a signal inputted to the first input terminal IN2 of the selection output unit, i.e., a signal outputted by the output terminal of the scanning unit corresponding to the selection output unit. "sg" denotes a signal outputted by the output terminal of the selection output unit. An operation process of the scanning unit in embodiments of the present disclosure is exemplarily described below by taking FIG. 3D and FIG. 3E as examples. In the selection output unit shown in FIG. 3D, the fourth transistor Q4, the fifth transistor Q5, the eighth transistor Q8 and the ninth transistor Q9 are P-type transistors; the sixth transistor Q6, the seventh transistor Q7, the tenth transistor Q10 and the eleventh transistor Q11 are N-type transistors. A high level signal is inputted to the first level signal input terminal VDD, and a low level signal is inputted to a second level signal input terminal VGL. An operation process of the selection output unit may include the following phases.

In a phase t31, a high level signal is inputted to the first input terminal IN2 of the selection output unit, and the fourth transistor Q4 is turned off. Through the action of the second inverter INV2, a low level signal is inputted to the gate electrode of the fifth transistor Q5, and the fifth transistor Q5 is turned on. The high level signal inputted to the first level signal input terminal VDD is transmitted to the second electrode of the fifth transistor Q5 through the turned-on fifth transistor Q5, and the sixth transistor Q6 and the tenth transistor Q10 are turned on. After the sixth transistor Q6 is turned on, the low level signal inputted to the second level signal input terminal VGL is transmitted to the second electrode of the sixth transistor Q6 through the turned-on sixth transistor Q6, i.e., the second electrode of the fourth transistor Q4, and the seventh transistor Q7 and the eleventh transistor Q11 are turned off. When the tenth transistor Q10 is turned on, a second level signal inputted to the second level signal input terminal VGL is transmitted to the second electrode of the tenth transistor Q10 through the turned-on tenth transistor Q10; the ninth transistor Q9 is turned on; the signal inputted to the second input terminal IN3 of the selection output unit is transmitted to the second electrode of the ninth transistor Q9; the eighth transistor is turned off; and the output terminal GOUT of the selection output unit outputs a signal with shading.

After the phase t31, a low level signal is inputted to the first input terminal IN2 of the selection output unit, and the fourth transistor Q4 is turned on. Through the action of the second inverter INV2, a high level signal is inputted to the gate electrode of the fifth transistor Q5, and the fifth transistor Q5 is turned off. The high level signal inputted to the first level signal input terminal VDD is transmitted to the second electrode of the fourth transistor Q4 through the turned-on fourth transistor Q4, and the seventh transistor Q7 and the eleventh transistor Q11 are turned on. The low level signal inputted to the second level signal input terminal VGL is transmitted to the second electrode of the seventh transistor Q7 through the turned-on seventh transistor Q7, i.e., the second electrode of the fifth transistor Q5, the sixth transistor Q6 and the tenth transistor Q10 are turned off. The level signal inputted to the second level signal input terminal VGL is transmitted to the second electrode of the eleventh transistor Q11 through the turned-on eleventh transistor Q11, i.e., the second electrode of the ninth transistor 19, and the eighth transistor Q8 are turned on. The output terminal GOUT of the selection output unit outputs a low level signal.

The above example is described by taking a configuration that the fourth transistor Q4, the fifth transistor Q5, the eighth transistor Q8 and the ninth transistor Q9 in the selection output unit are P-type transistors and the sixth transistor Q6, the seventh transistor Q7, the tenth transistor Q10 and the eleventh transistor Q11 are N-type transistors as an example. In another embodiment of the present disclosure, the fourth transistor Q4, the fifth transistor Q5, the eighth transistor Q8 and the ninth transistor Q9 may be N-type transistors, and the sixth transistor Q6, the seventh transistor Q7, the tenth transistor Q10 and the eleventh transistor Q11 may be P-type transistors.

Figure 4:
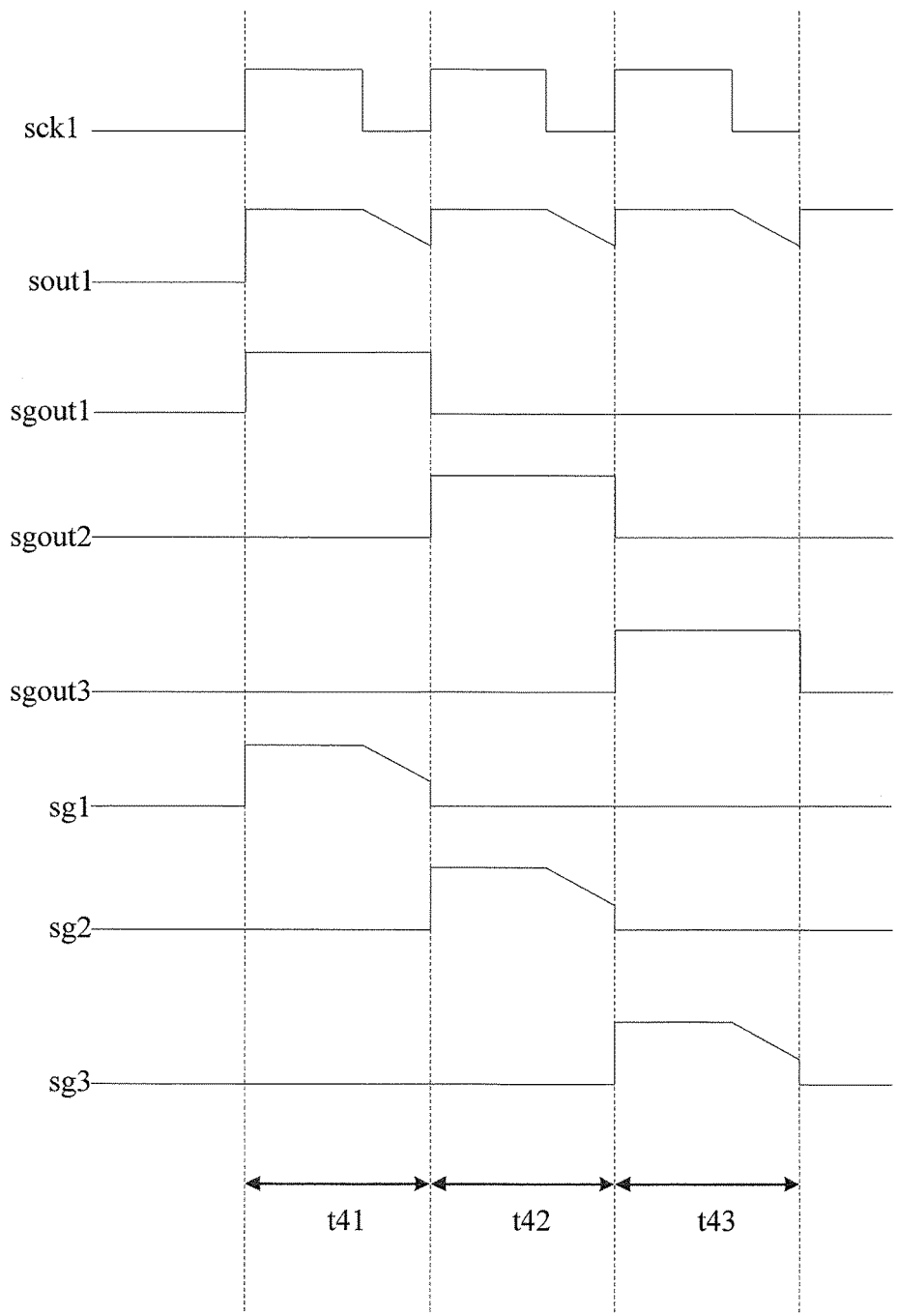
FIG. 4 is another drive timing diagram provided in embodiments of the present disclosure.

FIG. 4 is another timing diagram provided in embodiments of the present disclosure. By referring to FIG. 4, "sck1" denotes a signal outputted by the control signal output terminal of the control module, i.e., a signal inputted to the control terminal of the shading module and the control terminal of the scanning module. "sout1" denotes a shading voltage signal outputted by the output terminal of the shading module. "sgout1", "sgout2" and "sgout3" respectively denote the scanning control signals outputted by the scanning units (successive three levels) in the scanning module, and "sg1", "sg2" and "sg3" respectively denote scanning signals outputted by the selection output units (corresponding successive three levels of scanning units) in the scanning module. Since the scanning units in the scanning module successively output the scanning control signals at the moment of each rising edge of the signal "sck1", the shading module regulates a chamfer waveform when the signal "sck1" is at low level to generate a shading voltage signal, and the scanning module and the shading module share the signal "sck1" and are not mutually influenced. When the scanning module and the shading module share the signal "sck1" outputted by the output terminal of one control module, the shading module provides the shading voltage signal and the scanning module can successively output the scanning signals with chamfer. See signal waveforms of "sg1", "sg2" and "sg3" in phases t41, t42 and t43 for details. On a premise of ensuring that the scanning circuit outputs the scanning signal with shading, the control module just needs one control signal output terminal (control signal output pin) to realize supply of the clock signal of the entire scanning circuit, thereby saving the output pins of the control module, benefiting miniaturization of the control module, saving cost, also reducing signal wiring, benefiting PCB wiring, reducing an area of a circuit layout and being easy to realize a narrow bezel design of a display device.

Figure 5:
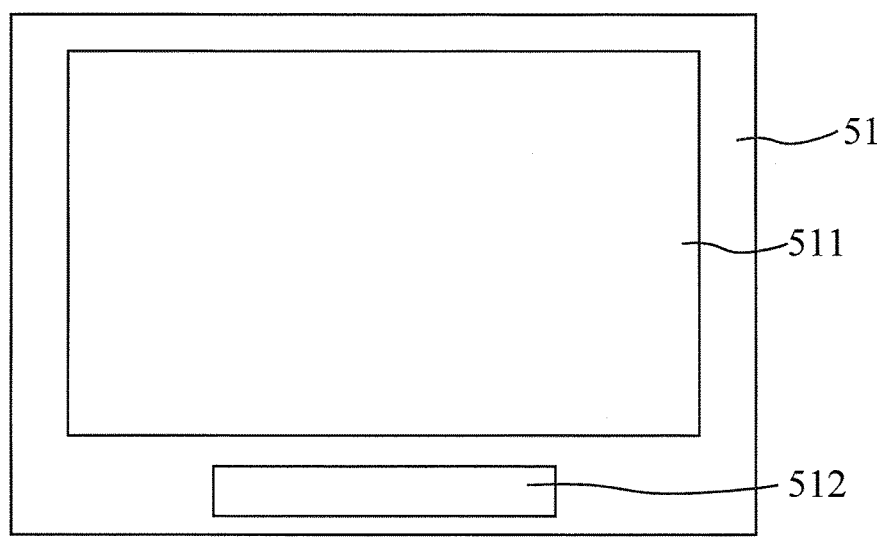
FIG. 5 is a schematic diagram illustrating a display device provided in embodiments of the present disclosure.

In addition, embodiments of the present disclose further provide a display device. FIG. 5 is a schematic diagram illustrating a display device provided in embodiments of the present disclosure. By referring to FIG. 5, the display device 51 includes a display panel 511 and a control board 512. The control board 512 is electrically connected to the display panel 511. The control board 512 includes the scanning circuit provided in any embodiment of the present disclosure, and is configured to provide driving signals and control signals for the display panel 511.

In other embodiments of the present disclosure, the scanning circuit provided in embodiments of the present disclosure can be integrated into the display panel 511, e.g., arranged in a non-display region of the display panel 511.

Figure 6:
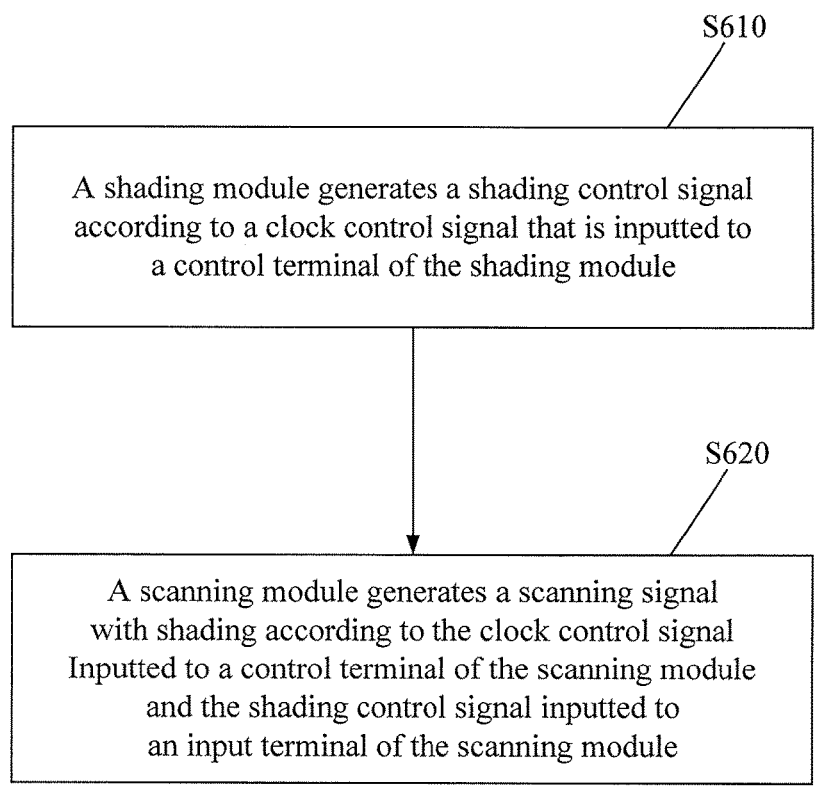
FIG. 6 is a flow chart illustrating a scanning circuit driving method provided in embodiments of the present disclosure.

Embodiments of the present disclosure further provide a method for driving a scanning circuit, configured to drive the scanning circuit provided in any embodiment of the present disclosure. By referring to FIG. 6, the driving method includes:

S610: the shading module generates the shading voltage signal according to the clock control signal inputted to its control terminal; and S620: the scanning module generates the scanning signal with shading according to the clock control signal inputted to its control terminal and the shading voltage signal inputted to its input terminal.

It shall be noted that the foregoing is only preferred embodiments of the present disclosure and used technical principles. It will be understood by those skilled in the art that the present disclosure is not limited to the specific embodiments described herein and that those skilled in the art can make various changes, modifications and substitutions within the scope of the present disclosure. Accordingly, although the present disclosure has been described in more detail by way of the above embodiments, the present disclosure is not limited to the above embodiments, and other equivalent embodiments may be included without departing from the spirit of the present disclosure. The scope of the disclosure is determined by the appended claims.

What is claimed is:

1. A scanning circuit, comprising:
   a control sub-circuit;
   a shading sub-circuit, wherein a control terminal of the shading sub-circuit is electrically connected to a control signal output terminal of the control sub-circuit, and the shading sub-circuit is configured to generate a shading voltage signal according to a clock control signal provided by the control sub-circuit; and
   a scanning sub-circuit, wherein a control terminal of the scanning sub-circuit is electrically connected to the control signal output terminal of the control sub-circuit, an input terminal of the scanning sub-circuit is electrically connected to an output terminal of the shading sub-circuit, and the scanning sub-circuit is configured to output a scanning signal with shading according to the clock control signal and the shading voltage signal,
   wherein the shading sub-circuit comprises a first transistor, a second transistor, a third transistor, a first resistor, a second resistor, a third resistor, a first capacitor, a second capacitor and a first inverter;
   a first electrode of the first transistor is electrically connected to an input terminal of the shading sub-circuit, a second electrode of the first transistor is electrically connected to the output terminal of the shading sub-circuit, a gate electrode of the first transistor is electrically connected to a first electrode of the first capacitor, and a second electrode of the first capacitor is grounded;
   one end of the first resistor is electrically connected to the first electrode of the first transistor, and the other end of the first resistor is electrically connected to the gate electrode of the first transistor;
   a first electrode of the second transistor is electrically connected to one end of the second resistor, and the other end of the second resistor is electrically connected to the first electrode of the first capacitor; a second electrode of the second transistor is grounded; and a gate electrode of the second transistor is electrically connected to the control terminal of the shading sub-circuit a first electrode of the third transistor is electrically connected to one end of the third resistor, and the other end of the third resistor is electrically connected to the output terminal of the shading sub-circuit a second electrode of the third transistor is grounded; and a gate electrode of the third transistor is electrically connected to an output terminal of the first inverter;
   an input terminal of the first inverter is electrically connected to the control terminal of the shading sub-circuit; and
   a first electrode of the second capacitor is electrically connected to the output terminal of the shading sub-circuit, and a second electrode of the second capacitor is grounded.

2. The scanning circuit according to claim 1, wherein the first transistor is a P-type transistor and the second transistor and the third transistor are N-type transistors.

3. The scanning circuit according to claim 1, wherein the scanning sub-circuit comprises a trigger signal input terminal, a plurality of output terminals, a plurality of cascaded subordinate scanning sub-circuits and a plurality of cascaded selection output sub-circuits, and each of the plurality of subordinate scanning sub-circuits correspond to a respective one of the plurality of selection output sub-circuits;

each of the plurality of subordinate scanning sub-circuits comprises a trigger signal input terminal, a clock signal input terminal and an output terminal; the trigger signal input terminal of a first-level subordinate scanning sub-circuit is electrically connected to the trigger signal input terminal of the scanning sub-circuit;

and for two adjacent levels of subordinate scanning sub-circuits, the output terminal of a proceeding subordinate scanning sub-circuit is electrically connected to the trigger signal input terminal of a succeeding subordinate scanning sub-circuit;

a clock signal input terminal of the subordinate scanning sub-circuit is electrically connected to the control terminal of the scanning sub-circuit; and each of the plurality of selection output sub-circuits comprises a first input terminal, a second input terminal and an output terminal, the first input terminal of the selection output sub-circuit is electrically connected to the output terminal of a corresponding subordinate scanning sub-circuit, the second input terminal of the selection output sub-circuit is electrically connected to the input terminal of the scanning sub-circuit; and output terminals of the plurality of selection output sub-circuits are electrically connected to the output terminals of the scanning sub-circuit in one-to-one correspondence.

4. The scanning circuit according to claim 3, wherein the subordinate scanning sub-circuit comprises a trigger; and an input terminal of the trigger is electrically connected to the trigger signal input terminal of the subordinate scanning sub-circuit, an output terminal of the trigger is electrically connected to the output terminal of the subordinate scanning sub-circuit, and a clock signal input terminal of the trigger is electrically connected to the clock signal input terminal of the subordinate scanning sub-circuit.

5. The scanning circuit according to claim 4, wherein the trigger is a D trigger.

6. The scanning circuit according to claim 3, wherein each of the plurality of selection output sub-circuits comprises a fourth transistor, a fifth transistor, a sixth transistor, a seventh transistor, an eighth transistor, a ninth transistor, a tenth transistor, an eleventh transistor, and a second inverter;

a first electrode of the fourth transistor is electrically connected to a first level signal input terminal of the selection output sub-circuit; a second electrode of the fourth transistor is electrically connected to a second electrode of the sixth transistor; and a gate electrode of the fourth transistor is electrically connected to the first input terminal of the selection output sub-circuit;

a first electrode of the fifth transistor is electrically connected to the first level signal input terminal, a second electrode of the fifth transistor is electrically connected to a second electrode of the seventh transistor, and a gate electrode of the fifth transistor is electrically connected to an output terminal of the second inverter;

a first electrode of the sixth transistor is electrically connected to a second level signal input terminal of the selection output sub-circuit, and a gate electrode of the sixth transistor is electrically connected to the second electrode of the fifth transistor;

a first electrode of the seventh transistor is electrically connected to the second level signal input terminal; and a gate electrode of the seventh transistor is electrically connected to the second electrode of the fourth transistor;

a first electrode of the eighth transistor is electrically connected to the second input terminal of the selection output sub-circuit, a second electrode of the eighth transistor is electrically connected to a second electrode of the tenth transistor, and a gate electrode of the eighth transistor is electrically connected to a second electrode of the ninth transistor;

a first electrode of the ninth transistor is electrically connected to the second input terminal of the selection output sub-circuit, the second electrode of the ninth transistor is electrically connected to the output terminal of the selection output sub-circuit, and a gate electrode of the ninth transistor is electrically connected to the second electrode of the eighth transistor;

a first electrode of the tenth transistor is electrically connected to the second level signal input terminal, and a gate electrode of the tenth transistor is electrically connected to the second electrode of the fifth transistor;

a first electrode of the eleventh transistor is electrically connected to the second level signal input terminal, a second electrode of the eleventh transistor is electrically connected to the second electrode of the ninth transistor, and a gate electrode of the eleventh transistor is electrically connected to the second electrode of the fourth transistor; and the input terminal of the second inverter is electrically connected to the first input terminal.

7. The scanning circuit according to claim 1, wherein the first transistor is an N-type transistor, and the second transistor and the third transistor are P-type transistors.

8. The scanning circuit according to claim 6, wherein in a first phase, a high level signal is inputted to the control terminal of the shading sub-circuit, the second transistor is turned on, and the third transistor is turned off; and in a second phase, a low level signal is inputted to the control terminal of the shading sub-circuit inputs, the second transistor is turned off, and the third transistor is turned on.

9. A display device, comprising:

a display panel; and a control board electrically connected to the display panel and comprising a scanning circuit, wherein the scanning circuit comprises:

a control sub-circuit;

a shading sub-circuit, wherein a control terminal of the shading sub-circuit is electrically connected to a control signal output terminal of the control module control sub-circuit, and the shading sub-circuit is configured to generate a shading voltage signal according to a clock control signal provided by the control sub-circuit; and a scanning sub-circuit, wherein a control terminal of the scanning sub-circuit is electrically connected to the control signal output terminal of the control sub-circuit, an input terminal of the scanning sub-circuit is electrically connected to an output terminal of the shading sub-circuit, and the scanning sub-circuit is configured to output a scanning signal with shading according to the clock control signal and the shading voltage signal, wherein the shading sub-circuit comprises a first transistor, a second transistor, a third transistor, a first resistor, a second resistor, a third resistor, a first capacitor, a second capacitor and a first inverter;

a first electrode of the first transistor is electrically connected to an input terminal of the shading sub-circuit a second electrode of the first transistor is electrically connected to the output terminal of the shading sub-circuit a gate electrode of the first transistor is electrically connected to a first electrode of the first capacitor; and a second electrode of the first capacitor is grounded;

one end of the first resistor is electrically connected to the first electrode of the first transistor, and the other end of the first resistor is electrically connected to the gate electrode of the first transistor;

a first electrode of the second transistor is electrically connected to one end of the second resistor, and the other end of the second resistor is electrically connected to the first electrode of the first capacitor; a second electrode of the second transistor is grounded; and a gate electrode of the second transistor is electrically connected to the control terminal of the shading sub-circuit a first electrode of the third transistor is electrically connected to one end of the third resistor, and the other end of the third resistor is electrically connected to the output terminal of the shading sub-circuit a second electrode of the third transistor is grounded; and a gate electrode of the third transistor is electrically connected to an output terminal of the first inverter;

an input terminal of the first inverter is electrically connected to the control terminal of the shading sub-circuit; and a first electrode of the second capacitor is electrically connected to the output terminal of the shading sub-circuit, and a second electrode of the second capacitor is grounded.

10. The display device according to claim 9, wherein the first transistor is an P-type transistor, and the second transistor and the third transistor are N-type transistors.

11. The display device according to claim 9, wherein the first transistor is an N-type transistor, and the second transistor and the third transistor are P-type transistors.

12. The display device according to claim 9, wherein the scanning sub-circuit comprises a trigger signal input terminal, a plurality of output terminals, a plurality of cascaded subordinate scanning sub-circuits and a plurality of cascaded selection output sub-circuits, and each of the plurality of subordinate scanning sub-circuits correspond to a respective one of the plurality of selection output sub-circuits;

each of the plurality of subordinate scanning sub-circuits comprises a trigger signal input terminal, a clock signal input terminal and an output terminal; the trigger signal input terminal of a first-level subordinate scanning sub-circuit is electrically connected to the trigger signal input terminal of the scanning sub-circuit; and for two adjacent levels of the subordinate scanning sub-circuits, the output terminal of a proceeding subordinate scanning sub-circuit is electrically connected to the trigger signal input terminal of a succeeding subordinate scanning sub-circuit;

a clock signal input terminal of the subordinate scanning sub-circuit is electrically connected to the control terminal of the scanning sub-circuit; and each of the plurality of selection output sub-circuits comprises a first input terminal, a second input terminal and an output terminal, the first input terminal of the selection output sub-circuit is electrically connected to the output terminal of a corresponding subordinate scanning sub-circuit, the second input terminal of the selection output sub-circuit is electrically connected to the input terminal of the scanning sub-circuit; and the output terminals of the plurality of selection output sub-circuits are electrically connected to the plurality of output terminals of the scanning sub-circuit in one-to-one correspondence.

13. The display device according to claim 12, wherein the subordinate scanning sub-circuit comprises a trigger; and an input terminal of the trigger is electrically connected to the trigger signal input terminal of the subordinate scanning sub-circuit, an output terminal of the trigger is electrically connected to the output terminal of the subordinate scanning sub-circuit, and a clock signal input terminal of the trigger is electrically connected to the clock signal input terminal of the subordinate scanning sub-circuit.

14. The display device according to claim 13, wherein the trigger is a D trigger.

15. The display device according to claim 12, wherein each of the plurality of selection output sub-circuits comprises a fourth transistor, a fifth transistor, a sixth transistor, a seventh transistor, an eighth transistor, a ninth transistor, a tenth transistor, an eleventh transistor, and a second inverter;

a first electrode of the fourth transistor is electrically connected to a first level signal input terminal of the selection output sub-circuit; a second electrode of the fourth transistor is electrically connected to a second electrode of the sixth transistor; and a gate electrode of the fourth transistor is electrically connected to the first input terminal of the selection output sub-circuit;

a first electrode of the fifth transistor is electrically connected to the first level signal input terminal, a second electrode of the fifth transistor is electrically connected to a second electrode of the seventh transistor, and a gate electrode of the fifth transistor is electrically connected to an output terminal of the second inverter;

a first electrode of the sixth transistor is electrically connected to the second level signal input terminal of the selection output sub-circuit, and a gate electrode of the sixth transistor is electrically connected to the second electrode of the fifth transistor;

a first electrode of the seventh transistor is electrically connected to the second level signal input terminal, and a gate electrode of the seventh transistor is electrically connected to the second electrode of the fourth transistor;

a first electrode of the eighth transistor is electrically connected to the second input terminal of the selection output sub-circuit, a second electrode of the eighth transistor is electrically connected to a second electrode of the tenth transistor, and a gate electrode of the eighth transistor is electrically connected to a second electrode of the ninth transistor;

a first electrode of the ninth transistor is electrically connected to the second input terminal of the selection output sub-circuit, a second electrode of the ninth transistor is electrically connected to the output terminal of the selection output sub-circuit, and a gate electrode of the ninth transistor is electrically connected to the second electrode of the eighth transistor;

a first electrode of the tenth transistor is electrically connected to the second level signal input terminal, and a gate electrode of the tenth transistor is electrically connected to the second electrode of the fifth transistor;

a first electrode of the eleventh transistor is electrically connected to the second level signal input terminal, a second electrode of the eleventh transistor is electrically connected to the second electrode of the ninth transistor, and a gate electrode of the eleventh transistor is electrically connected to the second electrode of the fourth transistor; and an input terminal of the second inverter is electrically connected to the first input terminal.

16. The display device according to claim 15, wherein in a first phase, a high level signal is inputted to the control terminal of the shading sub-circuit, the second transistor is turned on, and the third transistor is turned off; and in a second phase, a low level signal is inputted to the control terminal of the shading sub-circuit, the second transistor is turned off, and the third transistor is turned on.

17. The display device according to claim 15, wherein in a first moment, the signal inputted to the control terminal of the scanning sub-circuit is changed from a low level to a high level, and the output terminal Q21 of the first-level trigger 133 outputs a high level signal; in a second moment, the signal inputted to the control terminal of the scanning sub-circuit is changed from a low level to a high level, the rising edge of the next pulse of the signal inputted to the clock signal input terminal of the first-level trigger arrives, and a high level signal is inputted to the trigger signal input terminal of the second-level trigger; and in a third moment, the signal inputted to the control terminal CK1 of the scanning sub-circuit is changed from a low level to a high level, and the output terminal of the second-level trigger outputs a low level signal.

18. A method for driving a scanning circuit, wherein the scanning circuit comprises:

a shading sub-circuit, wherein a control terminal of the shading sub-circuit is electrically connected to a control signal output terminal of a control sub-circuit; and a scanning sub-circuit, wherein a control terminal of the scanning sub-circuit is electrically connected to the control signal output terminal of the control sub-circuit, and an input terminal of the scanning sub-circuit is electrically connected to an output terminal of the shading sub-circuit, wherein the shading sub-circuit comprises a first transistor, a second transistor, a third transistor, a first resistor, a second resistor, a third resistor, a first capacitor, a second capacitor and a first inverter;

a first electrode of the first transistor is electrically connected to an input terminal of the shading sub-circuit a second electrode of the first transistor is electrically connected to the output terminal of the shading sub-circuit a gate electrode of the first transistor is electrically connected to a first electrode of the first capacitor; and a second electrode of the first capacitor is grounded;

one end of the first resistor is electrically connected to the first electrode of the first transistor, and the other end of the first resistor is electrically connected to the gate electrode of the first transistor;

a first electrode of the second transistor is electrically connected to one end of the second resistor, and the other end of the second resistor is electrically connected to the first electrode of the first capacitor; a second electrode of the second transistor is grounded; and a gate electrode of the second transistor is electrically connected to the control terminal of the shading sub-circuit a first electrode of the third transistor is electrically connected to one end of the third resistor, and the other end of the third resistor is electrically connected to the output terminal of the shading sub-circuit a second electrode of the third transistor is grounded; and a gate electrode of the third transistor is electrically connected to an output terminal of the first inverter;

an input terminal of the first inverter is electrically connected to the control terminal of the shading sub-circuit; and a first electrode of the second capacitor is electrically connected to the output terminal of the shading sub-circuit, and a second electrode of the second capacitor is grounded, the driving method comprises:

the shading sub-circuit generates a shading voltage signal according to a clock control signal provided by the control sub-circuit; and the scanning sub-circuit generates a scanning signal with shading according to the clock control signal and the shading voltage signal.

* * * * *